United States Patent
Shida et al.

(10) Patent No.: US 8,480,920 B2
(45) Date of Patent: Jul. 9, 2013

(54) CHEMICAL MECHANICAL POLISHING AQUEOUS DISPERSION, METHOD OF PREPARING THE SAME, CHEMICAL MECHANICAL POLISHING AQUEOUS DISPERSION PREPARATION KIT, AND CHEMICAL MECHANICAL POLISHING METHOD

(75) Inventors: Hirotaka Shida, Yokkaichi (JP);
Akihiro Takemura, Yokkaichi (JP);
Taichi Abe, Yokkaichi (JP)

(73) Assignee: JSR Corporation, Tokyo (JP)

( * ) Notice: Subject to any disclaimer, the term of this patent is extended or adjusted under 35 U.S.C. 154(b) by 31 days.

(21) Appl. No.: 12/749,934

(22) Filed: Mar. 30, 2010

(65) Prior Publication Data
US 2010/0252774 A1    Oct. 7, 2010

(30) Foreign Application Priority Data

Apr. 2, 2009  (JP) .................................. 2009-89885
Apr. 2, 2009  (JP) .................................. 2009-89886
Apr. 2, 2009  (JP) .................................. 2009-89887

(51) Int. Cl.
*C09G 1/02*       (2006.01)
*H01L 21/3212*    (2006.01)

(52) U.S. Cl.
USPC ........ 252/79.1; 252/79.2; 252/79.3; 252/79.4; 438/689; 438/690; 438/691; 438/692; 438/693; 257/E21.304; 216/83; 216/88; 216/89

(58) Field of Classification Search
USPC ........... 252/79.1–79.4; 438/689–693; 216/83, 216/88, 89; 257/E21.304
See application file for complete search history.

(56) References Cited

U.S. PATENT DOCUMENTS

| 6,102,778 | A  | * | 8/2000  | Morita ............................ 451/41 |
| 6,162,368 | A  |   | 12/2000 | Li et al. |
| 6,491,837 | B1 | * | 12/2002 | Liu et al. ........................ 216/89 |
| 6,669,748 | B2 |   | 12/2003 | Nishida et al. |

(Continued)

FOREIGN PATENT DOCUMENTS

| JP | 2002-518845 | 6/2002 |
| JP | 2003-109921 | 4/2003 |

(Continued)

OTHER PUBLICATIONS

Steigerwald et al., "Chemical Mechanical Planarization of Microelectronic Materials" Wiley (2004) pp. 36-47.*

(Continued)

*Primary Examiner* — Lan Vinh
*Assistant Examiner* — David Kaufman
(74) *Attorney, Agent, or Firm* — Oblon, Spivak, McClelland, Maier & Neustadt, L.L.P.

(57) ABSTRACT

A chemical mechanical polishing aqueous dispersion that is used to polish a polishing target that includes a wiring layer that contains tungsten, the chemical mechanical polishing aqueous dispersion including: (A) a cationic water-soluble polymer; (B) an iron (III) compound; and (C) colloidal silica having an average particle diameter calculated from a specific surface area determined by the BET method of 10 to 60 nm, the content ($M_A$) (mass %) of the cationic water-soluble polymer (A) and the content ($M_C$) (mass %) of the colloidal silica (C) satisfying the relationship "$M_A/M_C=0.0001$ to 0.003", and the chemical mechanical polishing aqueous dispersion having a pH of 1 to 3.

15 Claims, 2 Drawing Sheets

U.S. PATENT DOCUMENTS

| | | | |
|---|---|---|---|
| 6,726,534 B1* | 4/2004 | Bogush et al. | 451/36 |
| 6,776,810 B1 | 8/2004 | Cherian et al. | |
| 7,247,567 B2 | 7/2007 | Vacassy et al. | |
| 7,294,576 B1* | 11/2007 | Chen et al. | 438/692 |
| 7,306,637 B2 | 12/2007 | Cherian et al. | |
| 7,560,384 B2 | 7/2009 | Shida et al. | |
| 7,582,127 B2 | 9/2009 | Vacassy et al. | |
| 2001/0000586 A1 | 5/2001 | Li et al. | |
| 2001/0008828 A1* | 7/2001 | Uchikura et al. | 451/41 |
| 2005/0079718 A1* | 4/2005 | Siddiqui et al. | 438/692 |
| 2005/0173669 A1* | 8/2005 | Kurata et al. | 252/79.1 |
| 2006/0169597 A1* | 8/2006 | Liu et al. | 205/680 |
| 2006/0201914 A1 | 9/2006 | Uchikura et al. | |
| 2006/0276041 A1 | 12/2006 | Uchikura et al. | |
| 2007/0266641 A1 | 11/2007 | Vacassy et al. | |
| 2008/0318427 A1 | 12/2008 | Kunitani et al. | |
| 2009/0124172 A1 | 5/2009 | Uchikura et al. | |
| 2009/0165395 A1 | 7/2009 | Ikeda et al. | |
| 2009/0181540 A1 | 7/2009 | Shida et al. | |
| 2009/0221213 A1 | 9/2009 | Namie et al. | |
| 2009/0291620 A1 | 11/2009 | Kunitani et al. | |
| 2009/0302266 A1 | 12/2009 | Takemura et al. | |
| 2009/0325383 A1 | 12/2009 | Andou et al. | |
| 2010/0075501 A1 | 3/2010 | Abe et al. | |

FOREIGN PATENT DOCUMENTS

| | | |
|---|---|---|
| JP | 2005-518091 | 6/2005 |
| JP | 2007-19093 | 1/2007 |
| JP | 2008-503875 | 2/2008 |

OTHER PUBLICATIONS

U.S. Appl. No. 12/529,545, filed Nov. 23, 2009, Taichi Matsumoto, et al.

U.S. Appl. No. 12/676,272, filed Mar. 3, 2010, Akihiro Takemura, et al.

U.S. Appl. No. 12/866,571, filed Aug. 6, 2010, Shida, et al.

U.S. Appl. No. 12/918,013, filed Aug. 17, 2010, Shida, et al.

U.S. Appl. No. 12/867,954, filed Aug. 17, 2010, Motonari, et al.

U.S. Appl. No. 12/919/897, filed Aug. 27, 2010, Nishimoto, et al.

* cited by examiner

CHEMICAL MECHANICAL POLISHING AQUEOUS DISPERSION, METHOD OF PREPARING THE SAME, CHEMICAL MECHANICAL POLISHING AQUEOUS DISPERSION PREPARATION KIT, AND CHEMICAL MECHANICAL POLISHING METHOD

The present application is based on and claims priority from Japanese Patent Application No. 2009-89885, filed on Apr. 2, 2009, Japanese Patent Application No. 2009-89886, filed on Apr. 2, 2009, and Japanese Patent Application No. 2009-89887, filed on Apr. 2, 2009, which are hereby incorporated by reference in their entirety.

BACKGROUND OF THE INVENTION

The present invention relates to a chemical mechanical polishing aqueous dispersion, a method of preparing the same, a chemical mechanical polishing aqueous dispersion preparation kit, and a chemical mechanical polishing method.

In recent years, lines (interconnects) formed in semiconductor devices have been increasingly reduced in dimension (width) along with an increase in the degree of integration of semiconductor devices. Therefore, a method that planarizes a wiring layer by chemical mechanical polishing (hereinafter may be referred to as "CMP") has been used. For example, JP-T-2002-518845 discloses a damascene process that deposits a conductor metal (e.g., aluminum, copper, or tungsten) by sputtering, plating, or the like in a minute groove or hole formed in an insulating film (e.g., silicon oxide) formed on a semiconductor substrate, and removes a metal film unnecessarily stacked around the groove or hole by CMP while allowing the metal to remain in the groove or hole.

In particular, tungsten that exhibits an excellent embedding capability is used for a via-hole that electrically connects lines in the vertical direction. For example, JP-T-2005-518091 discloses a polishing composition that contains an oxidizing agent (e.g., hydrogen peroxide), an iron catalyst (e.g., iron nitrate), and abrasive grains (e.g., silica) as a chemical mechanical polishing aqueous dispersion used to polish a tungsten film. A chemical mechanical polishing aqueous dispersion used to polish a tungsten film is required to exhibit a higher polishing rate and produce a flat polished surface. JP-A-2007-19093 and JP-T-2008-503875 disclose technology that adds a water-soluble polymer to a polishing composition in order to achieve the above properties in a well-balanced manner. However, a tungsten film-polishing aqueous dispersion that can achieve the above properties in a well-balanced manner has not been proposed.

A chemical mechanical polishing aqueous dispersion used to polish a tungsten film has a problem in that abrasive grains such as silica aggregate during long-term storage. A chemical mechanical polishing aqueous dispersion in which the abrasive grains aggregate cannot exhibit the desired polishing performance, so that various polishing defects may occur on the polishing target surface. For example, when a wiring layer is polished to a large extent, a depression referred to as dishing or erosion may occur. Surface defects referred to as scratches may also occur on the polishing target surface due to aggregated abrasive grains.

Since a chemical mechanical polishing aqueous dispersion used to polish a tungsten film tends to change in polishing performance during long-term storage, development of a means that can provide a chemical mechanical polishing aqueous dispersion having a constant quality has been desired. In particular, the above problems significantly occur when providing a chemical mechanical polishing aqueous dispersion in a concentrated state. Therefore, an improvement has been desired.

SUMMARY

According to a first aspect of the invention, there is provided a chemical mechanical polishing aqueous dispersion that is used to polish a polishing target that includes a wiring layer that contains tungsten, the chemical mechanical polishing aqueous dispersion comprising:

(A) a cationic water-soluble polymer;
(B) an iron (III) compound; and
(C) colloidal silica having an average particle diameter calculated from a specific surface area determined by the BET method of 10 to 60 nm, the content ($M_A$) (mass %) of the cationic water-soluble polymer (A) and the content ($M_C$) (mass %) of the colloidal silica (C) satisfying the relationship "$M_A/M_C$=0.0001 to 0.003", and the chemical mechanical polishing aqueous dispersion having a pH of 1 to 3.

According to a second aspect of the invention, there is provided a chemical mechanical polishing method comprising polishing a polishing target that includes a wiring layer that contains tungsten by using the above-described chemical mechanical polishing aqueous dispersion.

According to a third aspect of the invention, there is provided a chemical mechanical polishing aqueous dispersion preparation kit for preparing a chemical mechanical polishing aqueous dispersion that is used to polish a polishing target that includes a wiring layer that contains tungsten, the chemical mechanical polishing aqueous dispersion preparation kit comprising:

a first composition that has a pH of 8 to 11, and includes at least (C) colloidal silica having an average particle diameter calculated from a specific surface area measured by the BET method of 10 to 60 nm, and (E) a basic compound;

a second composition that has a pH of 1 to 3, and includes at least (A) a cationic water-soluble polymer and (D) an acidic compound; and a third composition that includes at least (B) an iron (III) compound and water.

According to a fourth aspect of the invention, there is provided a method of preparing a chemical mechanical polishing aqueous dispersion comprising mixing a kit that includes a first composition that has a pH of 8 to 11, and includes at least (C) colloidal silica having an average particle diameter calculated from a specific surface area measured by the BET method of 10 to 60 nm, and (E) a basic compound, a second composition that has a pH of 1 to 3, and includes at least (A) a cationic water-soluble polymer and (D) an acidic compound, and a third composition that includes at least (B) an iron (III) compound and water, to prepare a chemical mechanical polishing aqueous dispersion having a pH of 1 to 3.

DETAILED DESCRIPTION OF THE EMBODIMENT

Figure 1:
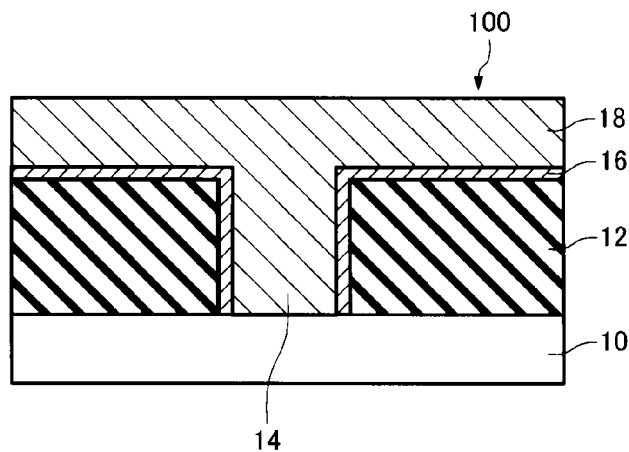
FIG. 1 is a cross-sectional view schematically illustrating a chemical mechanical polishing method according to one embodiment of the invention.

The invention may provide a chemical mechanical polishing aqueous dispersion and a chemical mechanical polishing aqueous method that are used to flatly polish a tungsten-deposited semiconductor wafer at high speed.

The invention may provide means for providing a chemical mechanical polishing aqueous dispersion that is used to flatly polish a polishing target that includes a wiring layer that contains tungsten at high speed while ensuring a constant quality. Specifically, the invention may provide a chemical mechanical polishing aqueous dispersion preparation kit that ensure long-term storage stability of colloidal silica contained in the chemical mechanical polishing aqueous dispersion.

According to one embodiment of the invention, there is provided a chemical mechanical polishing aqueous dispersion that is used to polish a polishing target that includes a wiring layer that contains tungsten, the chemical mechanical polishing aqueous dispersion comprising:

(A) a cationic water-soluble polymer;
(B) an iron (III) compound; and
(C) colloidal silica having an average particle diameter calculated from a specific surface area determined by the BET method of 10 to 60 nm, the content ($M_A$) (mass %) of the cationic water-soluble polymer (A) and the content ($M_C$) (mass %) of the colloidal silica (C) satisfying the relationship "$M_A/M_C$=0.0001 to 0.003", and the chemical mechanical polishing aqueous dispersion having a pH of 1 to 3.

In the above-described chemical mechanical polishing aqueous dispersion, the cationic water-soluble polymer (A) may be a polyethylenimine.

In the above-described chemical mechanical polishing aqueous dispersion, the content ($M_A$) (mass %) of the cationic water-soluble polymer (A) may be 0.0005 to 0.02 mass %.

In the above-described chemical mechanical polishing aqueous dispersion, the cationic water-soluble polymer (A) may have a number average molecular weight of 200 to 1,000,000.

In the above-described chemical mechanical polishing aqueous dispersion, the iron (III) compound (B) may be ferric nitrate.

In the above-described chemical mechanical polishing aqueous dispersion, the content ($M_B$) (mass %) of the iron (III) compound (B) may be 0.01 to 40 mass %.

In the above-described chemical mechanical polishing aqueous dispersion, the content ($M_C$) (mass %) of the colloidal silica (C) may be 1 to 40 mass %.

In the above-described chemical mechanical polishing aqueous dispersion, the polishing target may include an insulating film having a via-hole, and a tungsten film formed on the insulating film through a barrier metal film.

According to one embodiment of the invention, there is provided a chemical mechanical polishing method comprising polishing a polishing target that includes a wiring layer that contains tungsten by using the above-described chemical mechanical polishing aqueous dispersion.

According to one embodiment of the invention, there is provided a chemical mechanical polishing aqueous dispersion preparation kit for preparing a chemical mechanical polishing aqueous dispersion that is used to polish a polishing target that includes a wiring layer that contains tungsten, the chemical mechanical polishing aqueous dispersion preparation kit comprising:

a first composition that has a pH of 8 to 11, and includes at least (C) colloidal silica having an average particle diameter calculated from a specific surface area measured by the BET method of 10 to 60 nm, and (E) a basic compound;

a second composition that has a pH of 1 to 3, and includes at least (A) a cationic water-soluble polymer and (D) an acidic compound; and a third composition that includes at least (B) an iron (III) compound and water.

In the above-described chemical mechanical polishing aqueous dispersion preparation kit, the basic compound (E) may be potassium hydroxide or ammonia.

In the above-described chemical mechanical polishing aqueous dispersion preparation kit, the acidic compound (D) may be an organic acid.

In the above-described chemical mechanical polishing aqueous dispersion preparation kit, the organic acid may be maleic acid or malonic acid.

In the above-described chemical mechanical polishing aqueous dispersion preparation kit, the cationic water-soluble polymer (A) may be a polyethylenimine.

In the above-described chemical mechanical polishing aqueous dispersion preparation kit, the cationic water-soluble polymer (A) may have a number average molecular weight of 200 to 1,000,000.

In the above-described chemical mechanical polishing aqueous dispersion preparation kit, the iron (III) compound (B) may be ferric nitrate.

According to one embodiment of the invention, there is provided a method of preparing a chemical mechanical polishing aqueous dispersion comprising mixing a kit that includes a first composition that has a pH of 8 to 11, and includes at least (C) colloidal silica having an average particle diameter calculated from a specific surface area measured by the BET method of 10 to 60 nm, and (E) a basic compound, a second composition that has a pH of 1 to 3, and includes at least (A) a cationic water-soluble polymer and (D) an acidic compound, and a third composition that includes at least (B) an iron (III) compound and water, to prepare a chemical mechanical polishing aqueous dispersion having a pH of 1 to 3.

According to the above-described chemical mechanical polishing aqueous dispersion, a tungsten film can be flatly polished at high speed, and a polishing target surface formed by a tungsten film and an insulating film can also be flatly polished at high speed while suppressing erosion and the like.

According to the above-described chemical mechanical polishing aqueous dispersion preparation kit, since the first to third compositions can be stored separately, aggregation of the colloidal silica (C) contained in the first composition can be suppressed. Therefore, since the chemical mechanical polishing aqueous dispersion can be prepared by mixing the kit including the first to third compositions before use, a chemical mechanical polishing aqueous dispersion having a constant quality can be provided.

Embodiments of the invention are described in detail below.

1. Chemical Mechanical Polishing Aqueous Dispersion

A chemical mechanical polishing aqueous dispersion according to one embodiment of the invention is used to polish a polishing target that includes a wiring layer that contains tungsten, and comprises (A) a cationic water-soluble polymer, (B) an iron (III) compound, and (C) colloidal silica having an average particle diameter calculated from a specific surface area determined by the BET method of 10 to 60 nm, the content ($M_A$) (mass %) of the cationic water-soluble polymer (A) and the content ($M_C$) (mass %) of the colloidal silica (C) satisfying the relationship "$M_A/M_C$=0.0001 to 0.003", and the chemical mechanical polishing aqueous dispersion having a pH of 1 to 3.

The polishing target of the chemical mechanical polishing dispersion according to this embodiment is a semiconductor wafer or the like that includes a wiring layer that contains tungsten. The polishing target may include a silicon oxide film having a via-hole, and a tungsten film formed on the silicon oxide film through a barrier metal film. The tungsten film can be flatly polished at high speed using the chemical mechanical polishing dispersion according to this embodiment. Moreover, a polishing target surface formed by a tungsten film and an insulating film (e.g., silicon oxide film) can be flatly polished at high speed while suppressing erosion.

Each component of the chemical mechanical polishing aqueous dispersion according to this embodiment is described below.

1.1. Cationic Water-Soluble Polymer (A)

The chemical mechanical polishing aqueous dispersion according to this embodiment includes a cationic water-soluble polymer. It is considered that the cationic water-soluble polymer easily adheres to the surface of tungsten to form a protective film. This prevents a phenomenon in which tungsten is oxidized and becomes brittle to reduce the tungsten polishing rate.

Examples of the cationic water-soluble polymer include a polyalkyleneimine, polyvinylpyrrolidone, polyvinylamine, polyvinylpyridine, polyallylamine, polyvinylpiperazine, polylysine, and the like. Among these, a polyalkyleneimine is preferable, with polyethylenimine being more preferable. These cationic water-soluble polymers may be used either individually or in combination in the chemical mechanical polishing aqueous dispersion according to this embodiment.

The content of the cationic water-soluble polymer is preferably 0.0005 to 0.02 mass %, and more preferably 0.001 to 0.01 mass %, based on the total mass of the chemical mechanical polishing aqueous dispersion. If the content of the cationic water-soluble polymer is within the above range, the cationic water-soluble polymer effectively forms a protective film on the surface of tungsten to reduce the tungsten polishing rate. This prevents a situation in which the tungsten film is excessively polished so that dishing or erosion occurs. If the content of the cationic water-soluble polymer is within the above range, the tungsten polishing rate can be maintained within a suitable range so that the chemical mechanical polishing process can be completed within a moderate polishing time. This reduces the process cost (i.e., more practical).

The number average molecular weight of the cationic water-soluble polymer is preferably 200 to 1,000,000, and more preferably 10,000 to 100,000. If the number average molecular weight of the cationic water-soluble polymer is within the above range, the tungsten polishing rate can be advantageously reduced. Moreover, the stability of the chemical mechanical polishing aqueous dispersion according to this embodiment is further improved.

The number average molecular weight of the cationic water-soluble polymer refers to a pullulan-reduced value, and may be measured by gel permeation chromatography (column: "Shodex Asahipak GF-710HQ, GF-510HQ, and GF-310HQ" manufactured by Showa Denko K.K., eluant: 0.2M monoethanolamine aqueous solution).

1.2. Iron (III) Compound (B)

The chemical mechanical polishing aqueous dispersion according to this embodiment includes an iron (III) compound. The iron (III) compound oxidizes the surface of tungsten to form a brittle modified layer on the surface of tungsten so that tungsten can be easily polished.

The iron (III) compound may be an organic acid iron salt or an inorganic acid iron salt insofar as the above effect is achieved. Examples of the iron (III) compound include iron (III) nitrate (hereinafter may be referred to as "ferric nitrate"), ammonium iron (III) sulfate, iron (III) perchlorate, iron (III) chloride, iron sulfate (III), iron (III) citrate, ammonium iron (III) citrate, ammonium iron (III) oxalate, and the like. Among these iron (III) compounds, ferric nitrate is particularly preferable. When using ferric nitrate as the iron (III) compound, an oxide is easily formed on the surface of tungsten and easily removed by colloidal silica described later. Therefore, a flat polished surface can be obtained at a high polishing rate while suppressing a residue, dishing, and corrosion. These iron (III) compounds may be used either individually or in combination in the chemical mechanical polishing aqueous dispersion according to this embodiment.

The content of the iron (III) compound is preferably 0.01 to 40 mass %, and more preferably 0.05 to 20 mass %, based on the total mass of the chemical mechanical polishing aqueous dispersion. If the content of the iron (III) compound is within the above range, the surface of tungsten can be effectively oxidized so that the tungsten polishing rate can be increased while effectively suppressing dishing or erosion.

1.3. Colloidal Silica (C)

The chemical mechanical polishing aqueous dispersion according to this embodiment includes colloidal silica. The colloidal silica mechanically polishes a tungsten film and a silicon oxide film. The colloidal silica may be produced by a known method such as a method disclosed in JP-A-2003-109921.

The average particle diameter of the colloidal silica is 10 to 60 nm, and preferably 15 to 45 nm. If the average particle diameter of the colloidal silica is within the above range, a patterned wafer can be polished at high speed while suppressing erosion. If the average particle diameter of the colloidal silica is less than 10 nm, a chemical mechanical polishing aqueous dispersion that can polish a silicon oxide film at a sufficiently high polishing rate may not be obtained (i.e., erosion may not be suppressed). If the average particle diameter of the colloidal silica is more than 60 nm, an excellent step removal capability may not be achieved. (i.e., erosion may not be suppressed).

Note that two or more types of colloidal silica that differ in average particle diameter may be used in an arbitrary mixing ratio. Colloidal silica having a wider particle size distribution is provided by mixing two or more types of colloidal silica. In this case, colloidal silica having a relatively small particle size functions as a roller for colloidal silica having a relatively large particle size so that the fluidity of the chemical mechanical polishing aqueous dispersion can be improved. Therefore, the chemical mechanical polishing aqueous dispersion can be efficiently supplied to the space between a polishing pad and a polishing target, so that the polishing rate can be increased.

The average particle diameter of the colloidal silica refers to a value calculated from the specific surface area determined by the BET method. The specific surface area of the colloidal silica may be measured using an analyzer "Micrometrics FlowSorb II 2300" (manufactured by Shimadzu Corporation), for example. The average particle diameter of the colloidal silica is calculated from the specific surface area as follows.

The diameter of the colloidal silica is referred to as d (nm), and the specific gravity of the colloidal silica is referred to as rho (g/cm$^3$), on the assumption that the shape of the colloidal silica is spherical. The surface area A of n particles is npid$^2$. The mass N of n particles is rhonpid$^3$/6. The specific surface area S is indicated by the surface area of all particles contained in a powder per unit mass. Therefore, the specific surface area S (m$^2$/g) of n particles is A/N=6/rhod. Substituting the specific gravity rho (=2.2) of the colloidal silica in the above expression and converting the unit yields the following expression.

$$\text{Average particle diameter(nm)}=2727/S$$

The content of the colloidal silica is preferably 1 to 40 mass %, more preferably 1 to 30 mass %, and particularly preferably 1 to 20 mass %, based on the total mass of the chemical mechanical polishing aqueous dispersion. If the content of the colloidal silica is within the above range, a tungsten film and a silicon oxide film can be polished at a sufficiently high polishing rate. Moreover, aggregation of the colloidal silica is prevented so that a stable chemical mechanical polishing aqueous dispersion can be obtained.

1.4. Additives

The chemical mechanical polishing aqueous dispersion according to this embodiment may include an oxidizing agent other than the iron (III) compound. Examples of the oxidizing agent other than the iron (III) compound include ammonium persulfate, potassium persulfate, ferric nitrate, cerium diammonium nitrate, iron sulfate, ozone, potassium periodate, peracetic acid, hypochlorous acid, salts thereof, and the like. These oxidizing agents may be used either individually or in combination. Among these oxidizing agents, ammonium persulfate, potassium persulfate, and hydrogen peroxide are particularly preferable from the viewpoint of oxidizing power, compatibility with a protective film, handling capability, and the like.

The content of the oxidizing agent is preferably 0.05 to 5 mass %, and more preferably 0.08 to 3 mass %, based on the total mass of the chemical mechanical polishing aqueous dispersion.

1.5. Content Ratio

In the chemical mechanical polishing aqueous dispersion according to this embodiment, the content ($M_A$) (mass %) of the cationic water-soluble polymer (A) and the content ($M_C$) (mass %) of the colloidal silica (C) satisfy the relationship "$M_A/M_C$=0.0001 to 0.003". The ratio $M_A/M_C$ is preferably 0.0002 to 0.0024, and more preferably 0.0003 to 0.0022. If the ratio $M_A/M_C$ is within the above range, the ratio of the tungsten film polishing rate to the insulating film polishing rate can be made approximately unity. Therefore, erosion can be suppressed when polishing a polishing target surface formed by a tungsten film and an insulating film. If the ratio $M_A/M_C$ is less than 0.0001, the ratio of the tungsten film polishing rate is higher than the insulating film polishing rate. Therefore, erosion may occur when polishing a polishing target surface formed by a tungsten film and an insulating film. If the ratio $M_A/M_C$ is more than 0.003, the tungsten film polishing rate decreases so that the patterned wafer processing time increases.

The content ($M_A$) (mass %) of the cationic water-soluble polymer (A) and the content ($M_B$) (mass %) of the iron (III) compound (B) preferably satisfy the relationship "$M_A/M_B$=0.004 to 0.1". The ratio $M_A/M_B$ is more preferably 0.004 to 0.095, and particularly preferably 0.004 to 0.09. If the ratio $M_A/M_B$ is within the above range, the ratio of the tungsten film polishing rate to the insulating film polishing rate can be made approximately unity. Therefore, erosion can be suppressed when polishing a polishing target surface formed by a tungsten film and an insulating film. If the ratio $M_A/M_B$ is less than 0.004, the ratio of the tungsten film polishing rate is higher than the insulating film polishing rate. Therefore, erosion may occur when polishing a polishing target surface formed by a tungsten film and an insulating film. If the ratio $M_A/M_B$ is more than 0.1, the tungsten film polishing rate decreases so that the patterned wafer processing time increases.

1.6. pH

The pH of the chemical mechanical polishing aqueous dispersion according to this embodiment is preferably 1 to 3, and more preferably 1 to 2. If the pH of the chemical mechanical polishing aqueous dispersion is within the above range, a polishing target surface formed by a tungsten film and an insulating film can be polished advantageously. If the pH of the chemical mechanical polishing aqueous dispersion is more than 3, the polishing rate of the tungsten film and the silicon oxide film may decrease to a large extent. Moreover, precipitation or separation of the colloidal silica particles may occur so that the storage stability of the chemical mechanical polishing aqueous dispersion may deteriorate. If the pH of the chemical mechanical polishing aqueous dispersion is less than 1, the polishing rate of the tungsten film may increase to a large extent so that erosion may not be suppressed.

The pH of the chemical mechanical polishing aqueous dispersion may be adjusted to a value within the above range using an inorganic acid (e.g., hydrochloric acid, nitric acid, sulfuric acid, or phosphoric acid), an organic acid (e.g., maleic acid, malonic acid, tartaric acid, or oxalic acid), a strong alkali (e.g., potassium hydroxide, ammonia, or tetramethylammonium hydroxide), or the like.

The pH of the chemical mechanical polishing aqueous dispersion may be appropriately adjusted using a catalyst such as iron nitrate so that the chemical mechanical polishing aqueous dispersion has strong acidity within the above pH range. A polished surface having excellent flatness can be obtained by adjusting the amount of additives corresponding to the polishing target.

2. Chemical Mechanical Polishing Aqueous Dispersion Preparation Kit

A chemical mechanical polishing aqueous dispersion preparation kit (hereinafter may be simply referred to as "kit") according to one embodiment of the invention is used to polish a polishing target that includes a wiring layer that contains tungsten, and comprises a first composition that has a pH of 8 to 11, and includes at least (C) colloidal silica having an average particle diameter calculated from a specific surface area measured by the BET method of 10 to 60 nm, and (E) a basic compound, a second composition that has a pH of 1 to 3, and includes at least (A) a cationic water-soluble polymer and (D) an acidic compound, and a third composition that includes at least (B) an iron (III) compound and water.

The kit according to this embodiment is used to prepare the above chemical mechanical polishing aqueous dispersion, and is most preferable from the viewpoint of storage and usage. Each element (component) of the kit is described in detail below.

2.1. First Composition

The first composition of the kit according to this embodiment has a pH of 8 to 11, and includes at least the colloidal silica (C) having an average particle diameter calculated from a specific surface area measured by the BET method of 10 to 60 nm, and the basic compound (E). The pH of the first composition is adjusted to a weakly alkaline region (8.0 to 11.0) from the viewpoint of ensuring the dispersion stability of the colloidal silica (C).

The content of the colloidal silica (C) is preferably 1 to 60 mass %, and more preferably 5 to 50 mass %, based on the total mass of the first composition. If the content of the colloidal silica (C) is within the above range, the colloidal silica exhibits excellent storage stability. Therefore, a semiconductor wafer containing tungsten can be polished at high speed. Moreover, aggregation of the colloidal silica can be effectively reduced. Further, a semiconductor wafer containing tungsten can be polished at a higher speed.

The basic compound (E) is a pH adjusting agent that adjusts the pH of the first composition to a weakly alkaline region (8.0 to 11.0). Examples of the basic compound (E) include an organic base and an inorganic base. Examples of the organic base include tetramethylammonium hydroxide, triethylamine, and the like. Examples of the inorganic base include ammonia, potassium hydroxide, sodium hydroxide, and the like. Among these basic compounds (E), it is preferable to use ammonia or potassium hydroxide. These basic compounds (E) may be used either individually or in combination.

Examples of a dispersion medium include water, a mixed medium of water and an alcohol, a mixed medium of water and an organic solvent that is miscible with water, and the like. It is preferable to use water or a mixed medium of water and an alcohol, with water being particularly preferable.

The pH of the first composition is 8 to 11, and preferably 8 to 10. The pH of the first composition is adjusted to 8 to 11 for the following reason.

Colloidal silica normally has a configuration in which negatively-charged silica particles having a siloxane structure are dispersed in water. The amount of negative charge increases as the pH increases. The negatively-charged silica particles are surrounded by sodium ions and potassium ions contained in the aqueous solution so that an electrical double layer is formed. The potential of the outermost surface of the electrical double layer is referred to as a zeta potential. When the zeta potential of the colloidal silica in the slurry is low, the repulsive force between the particles decreases so that aggregation tends to occur. Aggregation of colloidal silica can be suppressed by adjusting the pH of the first composition to 8 to 11 (weakly alkaline region) by setting the zeta potential to be equal to or higher than a given value.

If the pH of the first composition is lower than 8, the colloidal silica (C) may aggregate. If the pH of the first composition is higher than 11, the colloidal silica (C) may be partially dissolved during long-term storage, so that the desired polishing properties may not be obtained.

2.2. Second Composition

The second composition of the kit according to this embodiment has a pH of 1 to 3, and includes at least the cationic water-soluble polymer (A) and the acidic compound (D). Since the second composition is mixed with the weakly alkaline first composition to obtain a neutral mixture, the pH of the second composition is adjusted to 1 to 3.

The content of the cationic water-soluble polymer (A) is preferably 0.001 to 5 mass %, and more preferably 0.01 to 3 mass %, based on the total mass of the second composition. If the content of the cationic water-soluble polymer (A) is within the above range, the tungsten film can be polished at a high polishing rate. In particular, polishing defects such as erosion can be more effectively suppressed when polishing a polishing target surface formed by a tungsten film and an insulating film. It is also possible to suppress occurrence of precipitates during storage due to an improvement in storage stability.

The acidic compound (D) is a pH adjusting agent that adjusts the pH of the second composition to an acidic region (1 to 3). Examples of the acidic compound (D) include an organic acid and an inorganic acid. The organic acid is preferably a compound that has two or more carboxyl groups in the molecule. Examples of the organic acid include maleic acid, malonic acid, citric acid, and the like. Examples of the inorganic acid include nitric acid, sulfuric acid, hydrochloric acid, and the like. Among these acidic compounds (D), it is preferable to use maleic acid or malonic acid. These acidic compounds (D) may be used either individually or in combination in the second composition.

Examples of a dispersion medium include water, a mixed medium of water and an alcohol, a mixed medium of water and an organic solvent that is miscible with water, and the like. It is preferable to use water or a mixed medium of water and an alcohol, with water being particularly preferable.

The pH of the second composition is 1 to 3, preferably 1 to 2.5, and still more preferably 1 to 2. The second composition is mixed with the first composition and the third composition described later to prepare a chemical mechanical polishing aqueous dispersion that is used to polish a wiring layer that contains tungsten. If the pH of the second composition is higher than 3, the first composition cannot be sufficiently neutralized. This makes it difficult to prepare a chemical mechanical polishing aqueous dispersion having a pH of 1 to 3 that is optimum for polishing a wiring layer that contains tungsten.

2.3. Third Composition

The third composition of the kit according to this embodiment includes at least the iron (III) compound (B) and water. It is preferable that the third composition does not include the components included in the first composition and the second composition from the viewpoint of storage stability.

The content of the iron (III) compound (B) is preferably 0.1 to 45 mass %, and more preferably 5 to 40 mass %, based on the total mass of the third composition. If the content of the iron (III) compound (B) is within the above range, a chemical mechanical polishing aqueous dispersion prepared by mixing the first to third compositions exhibits excellent polishing capability. It is also possible to suppress occurrence of precipitates during storage due to an improvement in storage stability. As a result, a chemical mechanical polishing aqueous dispersion prepared by mixing the first to third compositions exhibits excellent polishing capability.

Note that a tungsten film may not be sufficiently etched (i.e., excellent polishing capability may not be obtained) when using an iron (II) compound instead of the iron (III) compound.

Examples of a dispersion medium include water, a mixed medium of water and an alcohol, a mixed medium of water and an organic solvent that is miscible with water, and the like. It is preferable to use water or a mixed medium of water and an alcohol, with water being particularly preferable.

2.4. Additives

The first composition or the second composition may further include a water-soluble polymer, benzotriazole or a benzotriazole derivative, a surfactant, an oxidizing agent, and the like.

2.4.12 Water-Soluble Polymer

Examples of the water-soluble polymer include an anionic polymer, a cationic polymer, a nonionic polymer, and the like.

Examples of the anionic polymer include polyacrylic acid, polymethacrylic acid, polystyrenesulfonic acid, salts thereof, and the like. Examples of the cationic polymer include polyethylenimine, polyvinylpyrrolidone, polyvinylimidazole, and the like. Examples of the nonionic polymer include polyethylene oxide, polypropylene oxide, polyvinyl alcohol, polyacrylamide, and the like.

The content of the water-soluble polymer in the first composition is preferably 0.01 to 5 mass %, more preferably 0.1 to 1 mass %, and particularly preferably 0.4 to 0.8 mass %, based on the total mass of the first composition.

The content of the water-soluble polymer in the second composition is preferably 0.05 to 5 mass %, more preferably 0.1 to 4 mass %, and particularly preferably 1 to 3 mass %, based on the total mass of the second composition.

For example, a polyethylenimine may be added to the first composition insofar as the first composition has a pH of 8 to 11. The content of polyethylenimine is preferably 0.01 to 5 mass %, and more preferably 0.1 to 1 mass %, based on the total mass of the first composition. If the content of polyethylenimine is within the above range, the first composition has moderate viscosity, and the dispersion stability of the colloidal silica (C) can be improved.

2.4.2. Benzotriazole or Benzotriazole Derivative

The term "benzotriazole derivative" used herein refers to a compound obtained by replacing at least one hydrogen atom of benzotriazole with a functional group such as a carboxyl group, a methyl group, an amino group, or a hydroxyl group.

As the benzotriazole or the benzotriazole derivative, benzotriazole, methylbenzotriazole, 4-carboxybenzotriazole and salts thereof, 7-carboxybenzotriazole and salts thereof, benzotriazole butyl ester, 1-hydroxymethylbenzotriazole, 1-hydroxybenzotriazole, 1-(2,3-dihydroxypropyl)benzotriazole, 1-(2-hydroxyethyl)benzotriazole, 2-(benzotriazyl)ethanesulfonic acid and salts thereof, 1-(2-ethylhexylaminomethyl)benzotriazole, and the like are preferable. Among these, benzotriazole, methylbenzotriazole, 4-carboxybenzotriazole and salts thereof, 7-carboxybenzotriazole and salts thereof, benzotriazole butyl ester, 1-hydroxymethylbenzotriazole, and 1-hydroxybenzotriazole are more preferable, with benzotriazole being particularly preferable.

The content of the benzotriazole or the benzotriazole derivative in the first composition is preferably 0.01 to 5 mass %, more preferably 0.1 to 1 mass %, and particularly preferably 0.4 to 0.8 mass %, based on the total mass of the first composition.

The content of the benzotriazole or the benzotriazole derivative in the second composition is preferably 0.05 to 5 mass %, more preferably 0.1 to 4 mass %, and particularly preferably 1 to 3 mass %, based on the total mass of the second composition.

If the content of the benzotriazole or the benzotriazole derivative is within the above range, a polishing target that includes a wiring layer that contains tungsten can be polished at high speed to obtain an excellent polished surface.

For example, benzotriazole may be added to the first composition insofar as the first composition has a pH of 8 to 11. The content of benzotriazole is preferably 0.4 to 0.8 mass based on the total mass of the first composition. If the content of benzotriazole is within the above range, a polishing target that includes a wiring layer that contains tungsten can be polished at high speed using a chemical mechanical polishing aqueous dispersion prepared by mixing the first to third compositions to obtain an excellent polished surface.

2.4.3. Surfactant

Examples of the surfactant include a cationic surfactant, an anionic surfactant, an amphoteric surfactant, and a nonionic surfactant. Among these, an anionic surfactant and a nonionic surfactant are preferable.

Examples of the anionic surfactant include a carboxylate, a sulfonate, a sulfate salt, a phosphate salt, a fluorine-containing surfactant, and the like. Examples of the carboxylate include a fatty acid soap, an alkyl ether carboxylate, and the like. Examples of the sulfonate include an alkylbenzenesulfonate, an alkylnaphthalenesulfonate, an alpha-olefin sulfonate, and the like. Examples of the sulfate salt include a higher alcohol sulfate salt, an alkyl ether sulfate, a polyoxyethylene alkyl phenyl ether sulfate, and the like. Examples of the phosphate salt include an alkyl phosphate salt and the like. Examples of the fluorine-containing surfactant include a perfluoroalkyl compound and the like. Among these anionic surfactants, a fluorine-containing surfactant is particularly preferable.

Examples of the nonionic surfactant include a polyethylene glycol-type surfactant, an acetylene glycol-type surfactant (e.g., acetylene glycol, an ethylene oxide addition product of acetylene glycol, and an acetylene alcohol), and the like.

The content of the surfactant in the first composition is preferably 0.01 to 5 mass %, more preferably 0.1 to 1 mass %, and particularly preferably 0.4 to 0.8 mass %, based on the total mass of the first composition.

The content of the surfactant in the second composition is preferably 0.05 to 5 mass %, more preferably 0.1 to 4 mass %, and particularly preferably 1 to 3 mass %, based on the total mass of the second composition.

The surfactant functions as a dispersant for the colloidal silica (C) contained in the first composition. As the dispersant for the colloidal silica (C), it is preferable to use a water-soluble polymer (e.g., anionic polymer, ampholytic polymer, or nonionic polymer) or a surfactant (e.g., anionic surfactant, amphoteric surfactant, or nonionic surfactant), with an anionic polymer or an anionic surfactant being more preferable. These dispersants may be used either individually or in combination.

2.4.4. Oxidizing Agent

At least one of the first composition and the second composition may further include an oxidizing agent other than the iron (III) compound (B). Examples of the oxidizing agent other than the iron (III) compound (B) include ammonium persulfate, potassium persulfate, ferric nitrate, cerium diammonium nitrate, ferrous sulfate, ferrous nitrate, ozone, potassium periodate, peracetic acid, hypochlorous acid, salts thereof, and the like. Among these oxidizing agents, ammonium persulfate, potassium persulfate, and hydrogen peroxide are preferable from the viewpoint of oxidizing power, compatibility with a protective film, handling capability, and the like. These oxidizing agents may be used either individually or in combination.

The content of the oxidizing agent other than the iron (III) compound (B) is preferably 0.05 to 5 mass %, and more preferably 0.08 to 3 mass %, based on the total mass of the chemical mechanical polishing aqueous dispersion. The oxidizing agent other than the iron (III) compound (B) may be added to at least one of the first composition and the second composition.

2.5. Preparation of Chemical Mechanical Polishing Aqueous Dispersion

A method of preparing a chemical mechanical polishing aqueous dispersion according to one embodiment of the invention includes mixing a kit that includes a first composition that has a pH of 8 to 11, and includes at least (C) colloidal silica having an average particle diameter calculated from a specific surface area measured by the BET method of 10 to 60 nm, and (E) a basic compound, a second composition that has a pH of 1 to 3, and includes at least (A) a cationic water-soluble polymer and (D) an acidic compound, and a third composition that includes at least (B) an iron (III) compound and water, to prepare a chemical mechanical polishing aqueous dispersion having a pH of 1 to 3.

The chemical mechanical polishing aqueous dispersion prepared by the above method is used to polish a polishing target that includes a wiring layer that contains tungsten. The mixing ratio of the first to third compositions may be appropriately adjusted so that the colloidal silica (C) having an average particle diameter calculated from a specific surface area determined by the BET method of 10 to 60 nm, the cationic water-soluble polymer (A), and the iron (III) compound (B) are contained in the chemical mechanical polishing aqueous dispersion in the amounts and the ratio described in the section entitled "1. Chemical mechanical polishing aqueous dispersion", and the chemical mechanical polishing aqueous dispersion has a pH of 1 to 3.

The first to third compositions may be mixed and supplied by the following methods (a) to (c).

(a) The first to third compositions are mixed in advance to prepare a chemical mechanical polishing aqueous dispersion. The chemical mechanical polishing aqueous dispersion is supplied to a turntable from a slurry supply nozzle.

(b) The first composition or the second composition is mixed in advance with the third composition. The compositions are separately supplied to a turntable from a slurry supply nozzle, and mixed on the turntable.

(c) The first to third compositions are separately supplied to a turntable from a slurry supply nozzle, and mixed on the turntable.

The expression "mixed in advance" used herein refers to a method other than a method that separately supplies the compositions to a turntable and mixes the compositions on the turntable during a polishing operation. For example, the compositions may be mixed in advance in a tank or a supply line.

3. Chemical Mechanical Polishing Method

A chemical mechanical polishing method according to one embodiment of the invention polishes a polishing target that includes an insulating film having a via-hole and a tungsten film that is formed on the insulating film through a barrier metal film, and includes a first polishing step of polishing the tungsten film using the above chemical mechanical polishing aqueous dispersion, and a second polishing step of simultaneously polishing the tungsten film, the barrier metal film, and the insulating film using the above chemical mechanical polishing aqueous dispersion.

The chemical mechanical polishing method according to this embodiment is described in detail below with reference to the drawings.

3.1. Polishing Target

FIG. 1 shows an example of a polishing target 100 that is polished by the chemical mechanical polishing method according to this embodiment.

As shown in FIG. 1, a substrate 10 is provided. The substrate 10 may include a silicon substrate, and a silicon oxide film formed on the silicon substrate, for example. A functional device such as a transistor may be formed on the substrate 10. A silicon oxide film 12 (i.e., insulating film) is formed on the substrate 10 by a CVD method or a thermal oxidation method.

The silicon oxide film 12 is then patterned. A via-hole 14 is formed in the silicon oxide film 12 by photolithography using the silicon oxide film 12 as a mask.

A barrier metal film 16 is formed by sputtering on the surface of the silicon oxide film 12 and the inner wall surface of the via-hole 14. Since electrical connection between tungsten and silicon is poor, excellent electrical connection is implemented by providing the barrier metal film. The barrier metal film 16 may be formed of titanium and/or titanium nitride.

A tungsten film 18 is then formed by a CVD method.
The polishing target 100 is formed by these steps.

3.2. Chemical Mechanical Polishing Method 3.2.1. First Polishing Step

Figure 2:
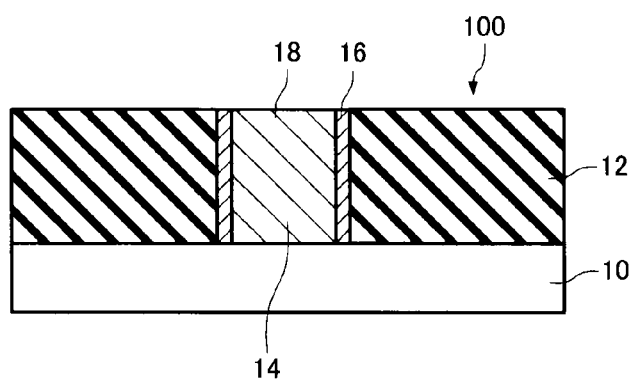
FIG. 2 is a cross-sectional view schematically illustrating a chemical mechanical polishing method according to one embodiment of the invention.

In the first polishing step, the barrier metal film 16 and the tungsten film 18 are polished using the above chemical mechanical polishing aqueous dispersion until the silicon oxide film 12 is exposed, as shown in FIG. 2. Since the above chemical mechanical polishing aqueous dispersion has an excellent polishing effect on the tungsten film and the barrier metal film, the barrier metal film 16 and the tungsten film 18 can be polished and removed by a single step.

3.2.2. Second Polishing Step

Figure 3:
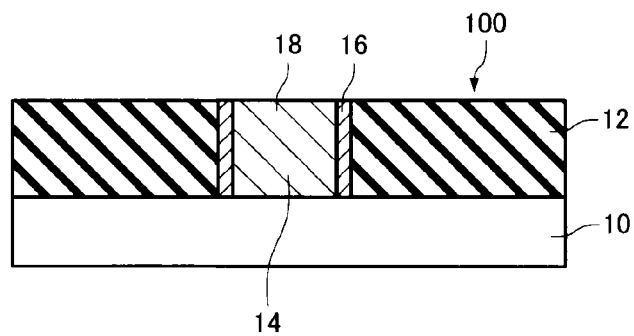
FIG. 3 is a cross-sectional view schematically illustrating a chemical mechanical polishing method according to one embodiment of the invention.

In the second polishing step, the barrier metal film 16, the tungsten film 18, and the silicon oxide film 12 are simultaneously polished using the above chemical mechanical polishing aqueous dispersion, as shown in FIG. 3. Since the above chemical mechanical polishing aqueous dispersion has a capability of non-selectively polishing the tungsten film and the silicon oxide film, a polished surface that exhibits excellent flatness can be obtained by the second polishing step.

Note that the chemical mechanical polishing aqueous dispersion used in the first polishing step in which the concentration of the iron (III) compound (B) is appropriately changed within the above range may be used as the chemical mechanical polishing aqueous dispersion used in the second polishing step. A polished surface that exhibits still more excellent flatness can be obtained by adjusting the concentration of the iron (III) compound (B) so that the ratio of the polishing rate of the tungsten film to the polishing rate of the silicon oxide film is almost one.

3.2.3. Chemical Mechanical Polishing Apparatus

Figure 4:
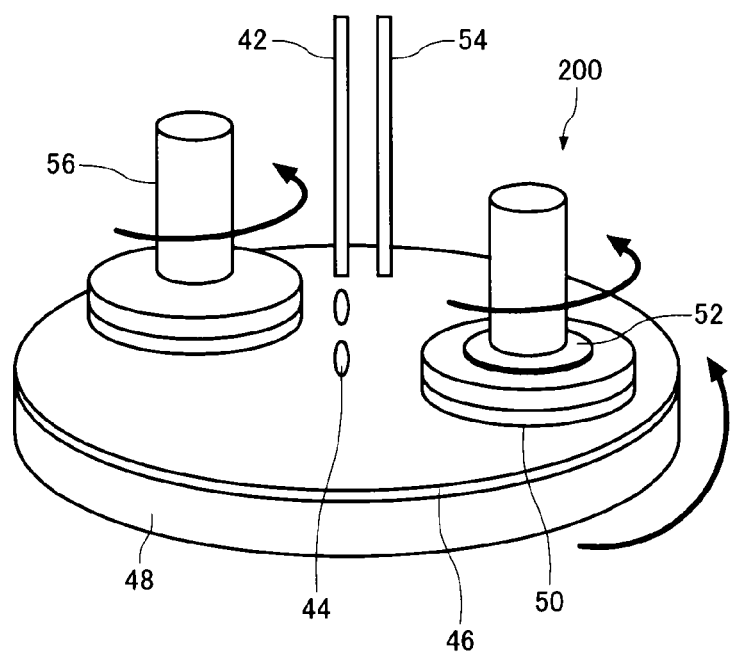
FIG. 4 is a perspective view schematically illustrating a chemical mechanical polishing apparatus.

A chemical mechanical polishing apparatus 200 shown in FIG. 4 may be used in the first polishing step and the second polishing step, for example. FIG. 4 is a perspective view schematically illustrating the chemical mechanical polishing apparatus 200. A carrier head 52 that holds a semiconductor substrate 50 is caused to come in contact with a turntable 48 to which an abrasive cloth 46 is attached while supplying a slurry 44 from a slurry supply nozzle 42 and rotating the turntable 48. FIG. 4 also shows a water supply nozzle 54 and a dresser 56.

The polishing load of the carrier head 52 may be selected within the range of 10 to 980 hPa, and is preferably 30 to 490 hPa. The rotational speed of the turntable 48 and the carrier head 52 may be appropriately selected within the range of 10 to 400 rpm, and is preferably 30 to 150 rpm. The flow rate of the slurry 44 supplied from the slurry supply nozzle 42 may be selected within the range of 10 to 1000 ml/min, and is preferably 50 to 400 ml/min.

Examples of a commercially available chemical mechanical polishing apparatus include "EPO-112", "EPO-222" (manufactured by Ebara Corporation), "LGP510", "LGP552" (manufactured by Lapmaster SFT Corporation), "Mirra" and "Reflexion" (manufactured by Applied Materials, Inc.), and the like.

4. Examples

The invention is further described below by way of examples. Note that the invention is not limited to the following examples.

4.1. Experimental Example 1

4.1.1. Preparation of chemical mechanical polishing aqueous dispersion (a) Preparation of Colloidal Silica Aqueous Dispersion No. 3 water glass (silica concentration: 24 mass %) was diluted with water to prepare a diluted sodium silicate aqueous solution having a silica concentration of 3.0 mass %. The diluted sodium silicate aqueous solution was passed through a hydrogen cation-exchange resin layer to obtain an active silica aqueous solution (pH: 3.1) from which most of the sodium ions were removed. The pH of the active silica aqueous solution was immediately adjusted to 7.2 by adding a 10 mass % potassium hydroxide aqueous solution with stirring. The mixture was then boiled and aged for three hours. The active silica aqueous solution (10-fold amount) of which the pH was adjusted to 7.2 was gradually added to the resulting aqueous solution so that colloidal silica was grown.

The colloidal silica-containing aqueous dispersion was concentrated under reduced pressure to obtain a colloidal silica aqueous dispersion (silica concentration: 32.0 mass %, pH: 9.8). The colloidal silica aqueous dispersion was passed through the hydrogen cation-exchange resin layer to remove most of the sodium ions. A 10 mass % potassium hydroxide aqueous solution was then added to the dispersion to obtain a colloidal silica aqueous dispersion (silica particle concentration: 28.0 mass %, pH: 10.0).

The average particle diameter of the colloidal silica calculated from the specific surface area determined by the BET method was 18 nm. The specific surface area of the colloidal silica particles was determined by the BET method using the colloidal silica collected by concentrating the silica particle dispersion and evaporating the resulting product to dryness.

Colloidal silica aqueous dispersions containing colloidal silica having an average particle diameter calculated from the specific surface area determined by the BET method of 6 nm, 15 nm, 25 nm, 45 nm, 60 nm, or 75 nm were produced in the same manner as described above, except for changing the aging time, the type and the amount of the basic compound, etc.

(b) Preparation of Chemical Mechanical Polishing Aqueous Dispersion

A polyethylene bottle was charged with 50 parts by mass of ion-exchanged water and the colloidal silica aqueous dispersion (silica: 4.5 parts by mass, average particle diameter: 18 nm). A polyethylenimine (number average molecular weight: 16,000) aqueous solution (polymer: 0.0005 parts by mass) was added to the mixture. After the addition of 4 parts by mass of ferric nitrate, the mixture was stirred for 15 minutes. After the addition of nitric acid and ion-exchanged water so that the total amount of the components was 100 parts by mass and a given pH was achieved, the mixture was filtered through a filter having a pore size of 5 micrometers to obtain a chemical mechanical polishing aqueous dispersion A.

Chemical mechanical polishing aqueous dispersions B to W were also prepared in the same manner as the chemical mechanical polishing aqueous dispersion A, except for changing the types and the amounts of the cationic water-soluble polymer (A), the iron (III) compound (B), and the colloidal silica (C) as shown in Tables 1 and 4. The number average molecular weight of the polyallylamine used in the chemical mechanical polishing aqueous dispersion 1 was 60,000. Two types of colloidal silica that differ in average particle diameter were used in the chemical mechanical polishing aqueous dispersion G. The average particle diameter of the colloidal silica after mixing calculated from the specific surface area determined by the BET method was 22.5 nm.

4.1.2. Evaluation Method

The basic polishing properties of the chemical mechanical polishing aqueous dispersion may be determined by calculating the ratio of the tungsten film polishing rate to the PETEOS film polishing rate measured when polishing a film formed on an unpatterned blanket wafer.

However, when chemically and mechanically polishing a patterned wafer in which a metal film is deposited on an insulating film in which a groove for forming a wiring pattern is formed, the patterned wafer is locally polished to a large extent. Specifically, elevations and depressions that reflect a groove for forming a wiring pattern are formed on the surface of the metal film formed on the patterned wafer before being subjected to CMP. A high pressure is locally applied during CMP depending on the pattern density so that the polishing rate increases in the area in which a high pressure is applied.

Therefore, in order to determine the polishing properties of the chemical mechanical polishing aqueous dispersion during CMP, it is necessary to evaluate the polishing rate and erosion by polishing a patterned wafer that imitates a semiconductor substrate. Therefore, the following patterned wafer was used for evaluation.

A polishing pad made of porous polyurethane ("IC1000" manufactured by Nitta Haas Inc.) was installed in a chemical mechanical polishing apparatus ("EPO-112" manufactured by Ebara Corporation). A polishing rate measurement substrate given below was chemically and mechanically polished under the following polishing conditions while supplying one of the chemical mechanical polishing aqueous dispersions A to W. The polishing rate and the selectivity ratio were evaluated by the following methods. The results are shown in Tables 1 to 4.

Polishing Rate Measurement Substrate

A patterned substrate (SEMATECH INTERNATIONAL (a test substrate obtained by processing an 8-inch wafer provided with a PETEOS film (400 nm) in a SEMATECH 854 pattern (depth: 400 nm), stacking a Ti/TiN film (25 nm), and then stacking a tungsten film (600 nm)) was used. The cross-sectional view of the patterned substrate is schematically shown in FIG. 1.

Polishing Conditions

Carrier head rotational speed: 80 rpm

Carrier head load: 250 hPa

Turntable rotational speed: 85 rpm

Supply rate of chemical mechanical polishing aqueous dispersion: 120 ml/min

Evaluation of Amount of Erosion and Polishing Time

The time required to polish the patterned substrate under the above conditions until the PETEOS film is exposed and removed in an amount of 50 nm was taken as the polishing time. The polished surface of the patterned substrate was measured using a high-resolution profiler ("HRP240ETCH" manufactured by KLA-Tencor) to determine the amount of erosion (nm) in the patterned area (width of tungsten line (line (L))/interval between tungsten lines (space (S))=1.5 micrometers/0.5 micrometers). The results are shown in Tables 1 to 4. The amount of erosion is indicated by a negative value when the film remained on the reference plane (upper side of insulating film). The amount of erosion is preferably −5 to 30 nm, and more preferably −2 to 20 nm.

The polishing time of the patterned wafer is preferably 200 seconds or less, and more preferably 150 seconds or less.

Evaluation of Polishing Rate

The patterned substrate subjected to the above evaluations was further polished for 30 seconds. The tungsten film polishing rate and the PETEOS film polishing rate were measured by the following methods, and the ratio of the tungsten film polishing rate to the PETEOS film polishing rate was calculated.

The thickness of the PETEOS film was measured after polishing in the patterned area (width of tungsten line (line (L))/width of insulating layer (space (S))=100 micrometers/100 micrometers) using an optical interference film analyzer ("NanoSpec 6100" manufactured by Nanometrics Japan Ltd.). The polishing rate was calculated from the thickness reduced by chemical mechanical polishing and the polishing time.

The amount of dishing (angstroms) in the patterned area (width of tungsten line (line (L))/width of insulating layer (space (S))=100 micrometers/100 micrometers) measured using a high-resolution profiler ("HRP240ETCH" manufactured by KLA-Tencor) was subtracted from the thickness of the PETEOS film to determine the thickness of the tungsten line. The tungsten film polishing rate was calculated from the thicknesses before and after chemical mechanical polishing and the polishing time.

The selectivity ratio (tungsten film polishing rate/silicon oxide film polishing rate) was evaluated as "Good" when the selectivity ratio was 0.7 to 1.3. The selectivity ratio was evaluated as "Bad" when the selectivity ratio was less than 0.7 or greater than 1.3.

TABLE 1

|  | Example 1 A | | Example 2 B | | Example 3 C | | Example 4 D | |
| --- | --- | --- | --- | --- | --- | --- | --- | --- |
|  | Type | mass % | Type | mass % | Type | mass % | Type | mass % |
| Cationic water-soluble polymer (A) | Poly-ethylene-imine | 0.0005 | Poly-ethylene-imine | 0.001 | Poly-ethylene-imine | 0.005 | Poly-ethylene-imine | 0.01 |
| Iron (III) compound (B) | Ferric nitrate | 4.00 | Ferric nitrate | 4.00 | Ferric nitrate | 4.00 | Ferric nitrate | 4.00 |
| Colloidal silica (C) | Average particle diameter 18 nm | 4.50 | Average particle diameter 18 nm | 3.00 | Average particle diameter 18 nm | 6.00 | Average particle diameter 18 nm | 10.00 |
| Content ratio ($M_A/M_C$) | 0.00011 | | 0.00033 | | 0.00083 | | 0.00100 | |
| pH | 1.3 | | 1.3 | | 1.3 | | 1.4 | |
| Tungsten film polishing rate (angstroms/min) | 950 | | 920 | | 1000 | | 1130 | |
| PETEOS film polishing rate (angstroms/min) | 860 | | 890 | | 980 | | 1150 | |
| Selective ratio | 1.10 | | 1.03 | | 1.02 | | 0.98 | |
| Erosion (nm) | 29 | | 25 | | 24 | | 23 | |
| Patterned wafer polishing time (sec) | 130 | | 140 | | 130 | | 120 | |

|  | Example 5 E | | Example 6 F | | Example 7 G | |
| --- | --- | --- | --- | --- | --- | --- |
|  | Type | mass % | Type | mass % | Type | mass % |
| Cationic water-soluble polymer (A) | Poly-ethylene-imine | 0.015 | Poly-ethylene-imine | 0.01 | Poly-ethylene-imine | 0.001 |
| Iron (III) compound (B) | Ferric nitrate | 4.00 | Ferric nitrate | 4.00 | Ferric nitrate | 4.00 |
| Colloidal silica (C) | Average particle diameter 18 nm | 10.00 | Average particle diameter 18 nm | 4.50 | Average particle diameter 18 nm | 2.00 |

TABLE 1-continued

|  |  |  |  |  |
|---|---|---|---|---|
|  |  |  |  | Average particle diameter 45 nm 1.00 |
| Content ratio ($M_A/M_C$) |  | 0.00150 | 0.00222 | 0.00033 |
| pH |  | 1.4 | 1.4 | 1.3 |
| Tungsten film polishing rate (angstroms/min) |  | 1030 | 870 | 1370 |
| PETEOS film polishing rate (angstroms/min) |  | 1110 | 900 | 1320 |
| Selective ratio |  | 0.93 | 0.97 | 1.04 |
| Erosion (nm) |  | 21 | 24 | 25 |
| Patterned wafer polishing time (sec) |  | 140 | 170 | 100 |

TABLE 2

|  | Example 8 H | | Example 9 I | | Example 10 J | | Example 11 K | | Example 12 L | | Example 13 M | |
|---|---|---|---|---|---|---|---|---|---|---|---|---|
|  | Type | mass % | Type | mass % | Type | mass % | Type | mass % | Type | mass % | Type | mass % |
| Cationic water-soluble polymer (A) | Poly-ethylene-imine | 0.005 | Poly-allyl-amine | 0.005 | Poly-ethylene-imine | 0.005 | Poly-ethylene-imine | 0.005 | Poly-ethylene-imine | 0.005 | Poly-ethylene-imine | 0.005 |
| Iron (III) compound (B) | Ferric nitrate | 4.00 | Ferric nitrate | 4.00 | Ferric nitrate | 4.00 | Ferric nitrate | 4.00 | Ferric nitrate | 4.00 | Ferric nitrate | 4.00 |
| Colloidal silica (C) | Average particle diameter 18 nm | 6.00 | Average particle diameter 18 nm | 6.00 | Average particle diameter 15 nm | 6.00 | Average particle diameter 25 nm | 6.00 | Average particle diameter 45 nm | 6.00 | Average particle diameter 60 nm | 6.00 |
| Content ratio ($M_A/M_C$) | 0.00083 | | 0.00083 | | 0.00083 | | 0.00083 | | 0.00083 | | 0.00083 | |
| pH | 2.8 | | 1.3 | | 1.3 | | 1.3 | | 1.3 | | 1.3 | |
| Tungsten film polishing rate (angstroms/min) | 700 | | 1130 | | 920 | | 1120 | | 1170 | | 1100 | |
| PETEOS film polishing rate (angstroms/min) | 720 | | 950 | | 720 | | 1150 | | 1250 | | 1250 | |
| Selective ratio | 0.97 | | 1.19 | | 1.28 | | 0.97 | | 0.94 | | 0.88 | |
| Erosion (nm) | 24 | | 28 | | 29 | | 25 | | 25 | | 28 | |
| Patterned wafer polishing time (sec) | 190 | | 190 | | 150 | | 140 | | 140 | | 150 | |

TABLE 3

|  | Comparative Example 1 N | | Comparative Example 2 O | | Comparative Example 3 P | | Comparative Example 4 Q | | Comparative Example 5 R | |
|---|---|---|---|---|---|---|---|---|---|---|
|  | Type | mass % | Type | mass % | Type | mass % | Type | mass % | Type | mass % |
| Cationic water-soluble polymer (A) | Poly-ethylene-imine | 0.0005 | Poly-ethylene-imine | 0.02 | Poly-ethylene-imine | 0.005 | Poly-ethylene-imine | 0.005 | — | |
| Iron (III) compound (B) | Ferric nitrate | 4.00 | Ferric nitrate | 4.00 | Ferric nitrate | 4.00 | Ferric nitrate | 4.00 | Ferric nitrate | 4.00 |
| Colloidal silica (C) | Average particle diameter 18 nm | 6.00 | Average particle diameter 18 nm | 6.00 | Average particle diameter 6 nm | 6.00 | Average particle diameter 75 nm | 6.00 | Average particle diameter 18 nm | 10.00 |
| Content ratio ($M_A/M_C$) | 0.00008 | | 0.00333 | | 0.00083 | | 0.00083 | | 0 | |
| pH | 1.3 | | 1.4 | | 1.3 | | 1.3 | | 1.2 | |
| Tungsten film polishing rate (angstroms/min) | 2920 | | 810 | | 1060 | | 1290 | | 4380 | |
| PETEOS film polishing rate (angstroms/min) | 960 | | 980 | | 110 | | 1470 | | 890 | |

TABLE 3-continued

|  | Comparative Example 1 N | | Comparative Example 2 O | | Comparative Example 3 P | | Comparative Example 4 Q | | Comparative Example 5 R | |
| --- | --- | --- | --- | --- | --- | --- | --- | --- | --- | --- |
|  | Type | mass % | Type | mass % | Type | mass % | Type | mass % | Type | mass % |
| Selective ratio | | 3.04 | | 0.83 | | 9.64 | | 0.88 | | 4.92 |
| Erosion (nm) | | 77 | | 18 | | 820 | | 730 | | 123 |
| Patterned wafer polishing time (sec) | | 110 | | 245 | | 200 | | 120 | | 100 |

TABLE 4

|  | Comparative Example 6 S | | Comparative Example 7 T | | Comparative Example 8 U | | Comparative Example 9 V | | Comparative Example 10 W | |
| --- | --- | --- | --- | --- | --- | --- | --- | --- | --- | --- |
|  | Type | mass % | Type | mass % | Type | mass % | Type | mass % | Type | mass % |
| Cationic water-soluble polymer (A) | Polyethylene-imine | 0.0005 | Poly-ethylene-imine | 0.0005 | Poly-ethylene-imine | 0.0050 | Poly-ethylene-imine | 0.0005 | Poly-ethylene-imine | 0.0005 |
| Iron (III) compound (B) | Ferric nitrate | 4.00 | Ferric nitrate | 4.00 | — | | Hydrogen peroxide | 4.00 | Ferrous nitrate | 4.00 |
| Colloidal silica (C) | Average particle diameter 18 nm | 6.00 | Average particle diameter 18 nm | 6.00 | Average particle diameter 18 nm | 6.00 | Average particle diameter 18 nm | 6.00 | Average particle diameter 18 nm | 6.00 |
| Content ratio ($M_A/M_C$) | | 0.00008 | | 0.00008 | | 0.00083 | | 0.00008 | | 0.00008 |
| pH | | 0.8 | | 3.6 | | 2.6 | | 2.4 | | 1.5 |
| Tungsten film polishing rate (angstroms/min) | | 2670 | | Could not be evaluated | | Could not be evaluated | | Could not be evaluated | | Could not be evaluated |
| PETEOS film polishing rate (angstroms/min) | | 1300 | | Could not be evaluated | | Could not be evaluated | | Could not be evaluated | | Could not be evaluated |
| Selective ratio | | 2.05 | | Could not be evaluated | | Could not be evaluated | | Could not be evaluated | | Could not be evaluated |
| Erosion (nm) | | 60 | | Could not be evaluated | | Could not be evaluated | | Could not be evaluated | | Could not be evaluated |
| Patterned wafer polishing time (sec) | | 125 | | Could not be evaluated | | Could not be evaluated | | Could not be evaluated | | Could not be evaluated |

4.1.3. Evaluation Results

When using the chemical mechanical polishing aqueous dispersions of Examples 1 to 13, the polishing target surface of the patterned substrate formed by the tungsten film and the PETEOS film could be flatly polished at high speed while suppressing erosion.

The chemical mechanical polishing aqueous dispersion of Comparative Example 1 had a polyethylenimine content of 0.0005 mass % (equal to that of Example 1), but had a content ratio ($M_A/M_C$) of less than 0.0001. As a result, the ratio of the tungsten film polishing rate to the PETEOS film polishing rate increased to 3.04, so that erosion occurred to a large extent.

The chemical mechanical polishing aqueous dispersion of Comparative Example 2 had a content ratio ($M_A/M_C$) of more than 0.003. As a result, the polishing time of the patterned wafer increased (the ratio of the tungsten film polishing rate to the PETEOS film polishing rate was 0.83).

In Comparative Example 3, colloidal silica having an average particle diameter of less than 10 nm was used. As a result, the PETEOS film polishing rate decreased to a large extent (the selectivity ratio was 9.64), so that erosion occurred to a large extent.

In Comparative Example 4, colloidal silica having an average particle diameter of more than 60 nm was used. Although the selectivity ratio was 0.88, the initial step of the patterned wafer could not be removed, and erosion occurred to a large extent.

The chemical mechanical polishing aqueous dispersion of Comparative Example 5 did not contain the cationic water-soluble polymer (A). As a result, the tungsten film polishing rate could not be reduced so that the ratio of the tungsten film polishing rate to the PETEOS film polishing rate increased to 4.92. Moreover, erosion occurred to a large extent.

The chemical mechanical polishing aqueous dispersion of Comparative Example 6 had a content ratio ($M_A/M_C$) of less than 0.0001, and a pH of less than 1. As a result, the tungsten film polishing rate could not be reduced so that the ratio of the tungsten film polishing rate to the PETEOS film polishing rate increased to 2.05. Moreover, erosion occurred to a large extent.

The chemical mechanical polishing aqueous dispersion of Comparative Example 7 had a pH of more than 3. As a result, the tungsten film polishing rate and the PETEOS film polishing rate decreased to a large extent so that an excellent polished surface could not be obtained (could not be evaluated).

The chemical mechanical polishing aqueous dispersion of Comparative Example 8 did not contain the iron (III) compound. As a result, the tungsten film polishing rate decreased to an impractical level (could not be evaluated).

The chemical mechanical polishing aqueous dispersion of Comparative Example 9 contained hydrogen peroxide that exhibits an oxidative effect instead of the iron (III) compound. As a result, the tungsten film polishing rate decreased to an impractical level (could not be evaluated).

The chemical mechanical polishing aqueous dispersion of Comparative Example 10 contained ferrous nitrate (iron (II) compound) instead of the iron (III) compound. As a result, the tungsten film polishing rate decreased to an impractical level (could not be evaluated).

As described above, since the chemical mechanical polishing aqueous dispersion according to one embodiment of the invention includes the cationic water-soluble polymer (A), the iron (III) compound (B), and the colloidal silica (C) having an average particle diameter calculated from a specific surface area determined by the BET method of 10 to 60 nm, the content ($M_A$) (mass %) of the cationic water-soluble polymer (A) and the content ($M_C$) (mass %) of the colloidal silica (C) satisfying the relationship "$M_A/M_C$=0.0001 to 0.003", and the chemical mechanical polishing aqueous dispersion having a pH of 1 to 3, a tungsten film can be flatly polished at high speed, and a polishing target surface formed by a tungsten film and an insulating film can also be flatly polished at high speed while suppressing erosion and the like.

4.2. Experimental Example 2

4.2.1. Preparation of Chemical Mechanical Polishing Aqueous Dispersion Preparation Kit (a) Preparation of first compositions A1 to A7 No. 3 water glass (silica concentration: 24 mass %) was diluted with water to prepare a diluted sodium silicate aqueous solution having a silica concentration of 3.0 mass %. The diluted sodium silicate aqueous solution was passed through a hydrogen cation-exchange resin layer to obtain an active silica aqueous solution (pH: 3.1) from which most of the sodium ions were removed. The pH of the active silica aqueous solution was immediately adjusted to 7.2 by adding a 10 mass % potassium hydroxide aqueous solution with stirring. The mixture was then boiled and aged for three hours. The active silica aqueous solution (10-fold amount) of which the pH was adjusted to 7.2 was gradually added to the resulting aqueous solution so that colloidal silica was grown.

The colloidal silica aqueous dispersion was concentrated under reduced pressure, and passed through the hydrogen cation-exchange resin layer to remove most of the sodium ions. A 10 mass % potassium hydroxide aqueous solution was then added to the dispersion to obtain a first composition A1 (silica particle concentration: 40.0 mass %, pH: 8.7).

The average particle diameter of the colloidal silica calculated from the specific surface area determined by the BET method was 18 nm. The specific surface area of the colloidal silica determined by the BET method refers to the specific surface area of the colloidal silica collected by concentrating the first composition A1 and evaporating the resulting product to dryness.

First compositions A2 to A7 were obtained in the same manner as described above, except for changing the aging time, the type and the amount of the basic compound, etc. The property values and the like of the first compositions A1 to A7 are summarized in Table 5.

TABLE 5

| | First composition | | | | | | | |
|---|---|---|---|---|---|---|---|---|
| | A1 | | A2 | | A3 | | A4 | |
| | Storage period | | | | | | | |
| | Immediately after preparation | 3 months | Immediately after preparation | 3 months | Immediately after preparation | 3 months | Immediately after preparation | 3 months |
| Content (mass %) of colloidal silica (C) | 40 | 40 | 30 | 30 | 40 | 40 | 40 | 40 |
| Average particle diameter (nm) | 18 | 18 | 15 | 15 | 25 | 25 | 45 | 45 |
| Basic compound | Potassium hydroxide | Potassium hydroxide | Potassium hydroxide | Potassium hydroxide | Potassium hydroxide | Potassium hydroxide | Potassium hydroxide | Potassium hydroxide |
| pH | 8.7 | 8.7 | 9.0 | 9.0 | 8.7 | 8.7 | 9.9 | 9.9 |

| | First composition | | | | | |
|---|---|---|---|---|---|---|
| | A5 | | A6 | | A7 | |
| | Storage period | | | | | |
| | Immediately after preparation | 3 months | Immediately after preparation | 3 months | Immediately after preparation | 3 months |
| Content (mass %) of colloidal silica (C) | 40 | 40 | 40 | Could not be evaluated | 40 | Could not be evaluated |
| Average particle diameter (nm) | 60 | 65 | 45 | | 45 | |
| Basic compound | Potassium hydroxide | Potassium hydroxide | Ammonia | | Potassium hydroxide | |
| pH | 10.5 | 10.5 | 7.0 | | 12.0 | |

(b) Preparation of Second Compositions C1 to C6

A polyethylene bottle was charged with 50 parts by mass of ion-exchanged water. 5 parts by mass of maleic acid was added to the polyethylene bottle, and completely dissolved. A polyethylenimine (number average molecular weight: 16,000) aqueous solution (polymer: 0.05 parts by mass) was then added to the mixture so that the total amount of the components was 100 parts by mass to obtain a second composition C1.

Second compositions C2 to C6 were obtained in the same manner as described above, except for changing the polyethylenimine concentration, the type and the amount of the acidic compound, etc. The property values of the second compositions C1 to C6 are summarized in Table 6.

4.2.3. Evaluation Method (a) Evaluation of Storage Stability

In Examples 14 to 23 and Comparative Examples 11 to 14, the state of the first to third compositions that were allowed to stand for three months in an airtight thermostat bath at 25° C. was evaluated. A chemical mechanical polishing aqueous dispersion was prepared using the first to third compositions

TABLE 6

| | Second composition | | | | | |
|---|---|---|---|---|---|---|
| | C1 | | C2 | | C3 | |
| | Storage period | | | | | |
| | Immediately after preparation | 3 months | Immediately after preparation | 3 months | Immediately after preparation | 3 months |
| Cationic water-soluble polymer (A) | Poly-ethylene-imine | Poly-ethylene-imine | Poly-ethylene-imine | Poly-ethylene-imine | Poly-ethylene-imine | Poly-ethylene-imine |
| Content (mass %) of cationic water-soluble polymer (A) | 0.05 | 0.05 | 0.75 | 0.75 | 0.75 | 0.75 |
| Acidic compound | Maleic acid | Maleic acid | Maleic acid | Maleic acid | Maleic acid | Maleic acid |
| pH | 1.1 | 1.1 | 1.4 | 1.4 | 2.2 | 2.2 |

| | Second composition | | | | | |
|---|---|---|---|---|---|---|
| | C4 | | C5 | | C6 | |
| | Storage period | | | | | |
| | Immediately after preparation | 3 months | Immediately after preparation | 3 months | Immediately after preparation | 3 months |
| Cationic water-soluble polymer (A) | Poly-ethylene-imine | Poly-ethylene-imine | Poly-ethylene-imine | Could not be evaluated | Poly-ethylene-imine | Poly-ethylene-imine |
| Content (mass %) of cationic water-soluble polymer (A) | 0.75 | 0.75 | 0.75 | | 0.75 | 0.75 |
| Acidic compound | Malonic acid | Malonic acid | Sulfuric acid | | Maleic acid | Maleic acid |
| pH | 2.6 | 2.6 | 0.9 | | 4.0 | 4.0 |

(c) Preparation of Third Composition E1

As a third composition E1, a 38 mass % iron (III) nitrate aqueous solution ("FN376" manufactured by Tama Chemicals Co., Ltd.) was used.

4.2.2. Preparation of Chemical Mechanical Polishing Aqueous Dispersion

A polyethylene bottle was charged with 50 parts by mass of ion-exchanged water. The first composition A1, the second composition C1, and the third composition E1 were sequentially added to the polyethylene bottle according to the composition shown in Table 7. The mixture was then stirred for 15 minutes. After the addition of ion-exchanged water so that the total amount of the components was 100 parts by mass, the mixture was filtered through a filter having a pore size of 5 micrometers to obtain a chemical mechanical polishing aqueous dispersion S1.

Chemical mechanical polishing aqueous dispersions S2 to S16 were obtained in the same manner as described above, except for changing the types and the amounts of the first to third compositions as shown in Tables 7 to 10.

after storage, and the polishing performance of the resulting chemical mechanical polishing aqueous dispersion was evaluated.

In Comparative Examples 15 and 16, a chemical mechanical polishing aqueous dispersion was prepared using the first to third compositions, placed in an airtight container, and allowed to stand for three months in an airtight thermostat bath at 25° C.

(b) Evaluation of Polishing Properties

A polishing pad made of porous polyurethane ("IC1000" manufactured by Nitta Haas Inc.) was installed in a chemical mechanical polishing apparatus ("EPO-112" manufactured by Ebara Corporation). The polishing rate measurement substrate was chemically and mechanically polished under the polishing conditions employed in Example 1 while supplying one of the chemical mechanical polishing aqueous dispersions S1 to S16. The polishing rate, erosion, and the selectivity ratio were evaluated in the same manner as in Example 1. The results are shown in Tables 7 to 10.

TABLE 7

|  |  |  | Example 14 | | Example 15 | | Example 16 | | Example 17 | | Example 18 | |
| --- | --- | --- | --- | --- | --- | --- | --- | --- | --- | --- | --- | --- |
| Composition of chemical mechanical polishing aqueous dispersion | Type | | S1 | | S2 | | S3 | | S4 | | S5 | |
| | Colloidal silica (C) | (mass %) | 6.0 | | 6.0 | | 6.0 | | 6.0 | | 6.0 | |
| | Cationic water-soluble polymer (A) | type (mass %) | Polyethyleneimine 0.005 | | Polyethyleneimine 0.005 | | Polyethyleneimine 0.005 | | Polyethyleneimine 0.005 | | Polyethyleneimine 0.005 | |
| | Iron (III) compound (B) | type (mass %) | Ferric nitrate 4.0 | | Ferric nitrate 4.0 | | Ferric nitrate 4.0 | | Ferric nitrate 4.0 | | Ferric nitrate 4.0 | |
| | Content ratio ($M_A/M_C$) | | 0.0008 | | 0.0008 | | 0.0008 | | 0.0008 | | 0.0008 | |
| | Content ratio ($M_A/M_B$) | | 0.0013 | | 0.0013 | | 0.0013 | | 0.0013 | | 0.0013 | |
| | pH | | 1.3 | | 1.3 | | 1.3 | | 1.3 | | 1.4 | |
| Compositions mixed | Storage period | | Immediately after preparation | 3 months | Immediately after preparation | 3 months | Immediately after preparation | 3 months | Immediately after preparation | 3 months | Immediately after preparation | 3 months |
| | First composition | | A1 | A1 | A2 | A2 | A3 | A3 | A4 | A4 | A5 | A5 |
| | Second composition | | C1 | C1 | C1 | C1 | C1 | C1 | C1 | C1 | C1 | C1 |
| | Third composition | | E1 | E1 | E1 | E1 | E1 | E1 | E1 | E1 | E1 | E1 |
| Evaluation results | Polishing rate (angstroms/min) | Tungsten film | 1000 | 1050 | 920 | 900 | 1120 | 1100 | 1170 | 1150 | 1100 | 940 |
| | | Silicon oxide film | 980 | 980 | 720 | 720 | 1150 | 1130 | 1250 | 1200 | 1250 | 1280 |
| | Selective ratio | | 1.02 | 1.07 | 1.28 | 1.25 | 0.97 | 0.97 | 0.94 | 0.96 | 0.88 | 0.73 |
| | Erosion (nm) | | 24 | 24 | 29 | 29 | 25 | 25 | 25 | 25 | 28 | 28 |
| | Patterned wafer polishing time (sec) | | 130 | 130 | 140 | 140 | 130 | 130 | 120 | 120 | 140 | 160 |

TABLE 8

|  |  |  | Example 19 | | Example 20 | | Example 21 | | Example 22 | | Example 23 | |
| --- | --- | --- | --- | --- | --- | --- | --- | --- | --- | --- | --- | --- |
| Composition of chemical mechanical polishing aqueous dispersion | Type | | S6 | | S7 | | S8 | | S9 | | S10 | |
| | Colloidal silica (C) | (mass %) | 6.0 | | 6.0 | | 10.0 | | 10.0 | | 10.0 | |
| | Cationic water-soluble polymer (A) | type (mass %) | Polyethyleneimine 0.110 | | Polyethyleneimine 0.025 | | Polyethyleneimine 0.075 | | Polyethyleneimine 0.075 | | Polyethyleneimine 0.075 | |
| | Iron (III) compound (B) | type (mass %) | Ferric nitrate 4.0 | | Ferric nitrate 4.0 | | Ferric nitrate 2.0 | | Ferric nitrate 2.0 | | Ferric nitrate 2.0 | |
| | Content ratio ($M_A/M_C$) | | 0.0183 | | 0.0042 | | 0.0075 | | 0.0075 | | 0.0075 | |
| | Content ratio ($M_A/M_B$) | | 0.0275 | | 0.0063 | | 0.0375 | | 0.0375 | | 0.0375 | |
| | pH | | 1.5 | | 1.5 | | 1.5 | | 2.4 | | 2.8 | |
| Compositions mixed | Storage period | | Immediately after preparation | 3 months | Immediately after preparation | 3 months | Immediately after preparation | 3 months | Immediately after preparation | 3 months | Immediately after preparation | 3 months |
| | First composition | | A4 | A4 | A4 | A4 | A1 | A1 | A1 | A1 | A1 | A1 |
| | Second composition | | C2 | C2 | C2 | C2 | C2 | C2 | C3 | C3 | C4 | C4 |
| | Third composition | | E1 | E1 | E1 | E1 | E1 | E1 | E1 | E1 | E1 | E1 |
| Evaluation results | Polishing rate (angstroms/min) | Tungsten film | 760 | 760 | 790 | 770 | 780 | 780 | 740 | 730 | 700 | 700 |
| | | Silicon oxide film | 980 | 990 | 1000 | 980 | 1100 | 1100 | 600 | 590 | 560 | 560 |
| | Selective ratio | | 0.78 | 0.77 | 0.79 | 0.79 | 0.71 | 0.71 | 1.23 | 1.24 | 1.25 | 1.25 |
| | Erosion (nm) | | 18 | 18 | 19 | 19 | 11 | 11 | 24 | 24 | 29 | 29 |
| | Patterned wafer polishing time (sec) | | 190 | 190 | 180 | 180 | 180 | 180 | 190 | 190 | 190 | 190 |

TABLE 9

|  |  |  | Comparative Example 11 | Comparative Example 12 | Comparative Example 13 | Comparative Example 14 |
| --- | --- | --- | --- | --- | --- | --- |
| Composition of chemical mechanical polishing aqueous dispersion | Type | | S11 | S12 | S13 | S14 |
| | Colloidal silica (C) | (mass %) | 6.0 | 6.0 | 6.0 | 6.0 |
| | Cationic water-soluble polymer (A) | type (mass %) | Polyethyleneimine 0.110 | Polyethyleneimine 0.110 | Polyethyleneimine 0.110 | Polyethyleneimine 0.110 |

TABLE 9-continued

| | | | Comparative Example 11 | | Comparative Example 12 | | Comparative Example 13 | | Comparative Example 14 | |
|---|---|---|---|---|---|---|---|---|---|---|
| | Iron (III) compound (B) | type (mass %) | Ferric nitrate 4.0 | | Ferric nitrate 4.0 | | Ferric nitrate 4.0 | | Ferric nitrate 4.0 | |
| | Content ratio ($M_A/M_C$) | | 0.0183 | | 0.0183 | | 0.0183 | | 0.0183 | |
| | Content ratio ($M_A/M_B$) | | 0.0275 | | 0.0275 | | 0.0275 | | 0.0275 | |
| | pH | | 1.3 | | 1.8 | | 1.3 | | 6.2 | |
| Compositions mixed | Storage period | | Immediately after preparation | 3 months | Immediately after preparation | 3 months | Immediately after preparation | 3 months | Immediately after preparation | 3 months |
| | First composition | | A6 | A6 | A7 | A7 | A4 | A4 | A4 | A4 |
| | Second composition | | C2 | C2 | C2 | C2 | C5 | C5 | C6 | C6 |
| | Third composition | | E1 | E1 | E1 | E1 | E1 | E1 | E1 | E1 |
| Evaluation results | Polishing rate (angstroms/min) | Tungsten film | 840 | Could not be evaluated (A6 aggregated) | 700 | Could not be evaluated (A7 was dissolved) | 840 | Could not be evaluated (C5 aggregated) | Could not be evaluated (aggregated due to mixing) | Could not be evaluated (aggregated due to mixing) |
| | | Silicon oxide film | 1050 | | 890 | | 1050 | | | |
| | Selective ratio | | 0.80 | | 0.79 | | 0.80 | | | |
| | Erosion (nm) | | 18 | | 20 | | 18 | | | |
| | Patterned wafer polishing time (sec) | | 180 | | 190 | | 180 | | | |

TABLE 10

| | | | Comparative Example 15 | Comparative Example 16 |
|---|---|---|---|---|
| Composition of chemical mechanical polishing aqueous dispersion | | Type | S15 | S16 |
| | Colloidal silica (C) | (mass %) | 6.0 | 6.0 |
| | Cationic water-soluble polymer (A) | type (mass %) | Polyethyleneimine 0.005 | Polyethyleneimine 0.110 |
| | Iron (III) compound (B) | type (mass %) | Ferric nitrate 4.0 | Ferric nitrate 4.0 |
| | Content ratio ($M_A/M_C$) | | 0.0008 | 0.0183 |
| | Content ratio ($M_A/M_B$) | | 0.0013 | 0.0275 |
| | pH | | 1.3 | 1.5 |
| Compositions mixed | Storage period | | 3 months | 3 months |
| | First composition | | A4 | A4 |
| | Second composition | | C1 | C2 |
| | Third composition | | E1 | E1 |
| Evaluation results | Polishing rate (angstroms/min) | Tungsten film | Aggregates and precipitates were produced during storage | Aggregates and precipitates were produced during storage |
| | | Silicon oxide film | | |
| | Selective ratio | | | |
| | Erosion (nm) | | | |
| | Patterned wafer polishing time (sec) | | | |

4.2.4 Evaluation Results (a) Storage stability of first compositions A1 to A7

Table 5 shows the evaluation results for the storage stability of the first compositions A1 to A7 after being allowed to stand for three months.

The first compositions A1 to A4 did not show a change when allowed to stand for three months in an airtight thermostat bath at 25° C. (i.e., exhibited good storage stability).

Since the first composition A5 had a pH of 10.5, the average particle diameter of the colloidal silica increased from 60 nm to 65 nm (allowable level) when the first composition A5 was allowed to stand for three months in an airtight thermostat bath at 25° C.

Since the first composition A6 had a pH of 7, the colloidal silica aggregated when the first composition A6 was allowed to stand for three months in an airtight thermostat bath at 25° C.

Since the first composition A7 had a pH of 12, the colloidal silica was dissolved when the first composition A7 was allowed to stand for three months in an airtight thermostat bath at 25° C.

(b) Storage Stability of Second Compositions C1 to C6

Table 6 shows the evaluation results for the storage stability of the second compositions C1 to C6 after being allowed to stand for three months.

The second compositions C1 to C4 and C6 did not show a change when allowed to stand for three months in an airtight thermostat bath at 25° C. (i.e., exhibited good storage stability).

Since the second composition C5 had a pH of 0.9, a number of aggregates were produced when the second composition C5 was allowed to stand for three months in an airtight thermostat bath at 25° C.

(c) Storage Stability of Third Composition E1

The third composition E1 did not show a change when allowed to stand for three months in an airtight thermostat bath at 25° C. (i.e., exhibited good storage stability).

(d) Polishing Properties

Since the first to third compositions used in Examples 14 to 23 exhibited good storage stability, an excellent chemical mechanical polishing aqueous dispersion could be prepared by mixing the first to third compositions that were allowed to stand for three months. Therefore, the polishing properties of the chemical mechanical polishing aqueous dispersion prepared by mixing the first to third compositions immediately after preparation were almost equal to those of the chemical mechanical polishing aqueous dispersion prepared by mixing the first to third compositions that were allowed to stand for three months. The chemical mechanical polishing aqueous dispersions of Examples 14 to 23 showed excellent evaluation results for the polishing rate, the selectivity ratio, erosion, and the polishing time of the patterned substrate.

In the first composition A6 used in Comparative Example 11, the colloidal silica aggregated when the first composition A6 was allowed to stand for three months. Therefore, an excellent chemical mechanical polishing aqueous dispersion could not be prepared when mixing the kit including the first to third compositions that were allowed to stand for three months.

In the first composition A7 used in Comparative Example 12, the colloidal silica was dissolved when the first composition A7 was allowed to stand for three months. Therefore, an excellent chemical mechanical polishing aqueous dispersion could not be prepared when mixing the kit including the first to third compositions that were allowed to stand for three months.

In the second composition C5 used in Comparative Example 13, a number of aggregates were produced when the second composition C5 was allowed to stand for three months. Therefore, an excellent chemical mechanical polishing aqueous dispersion could not be prepared when mixing the kit including the first to third compositions that were allowed to stand for three months.

The second composition C6 used in Comparative Example 14 had a pH of more than 3. Therefore, the chemical mechanical polishing aqueous dispersion prepared by mixing the first to third compositions had a pH of 6.2 (i.e., neutralization was insufficient). As a result, aggregates or precipitates were produced in the chemical mechanical polishing aqueous dispersion (the polishing properties could not be evaluated).

In Comparative Example 15, a chemical mechanical polishing aqueous dispersion having the same composition as that of Example 4 was prepared by mixing the first to third compositions immediately after the preparation, and allowed to stand for three months. In the chemical mechanical polishing aqueous dispersion of Comparative Example 5, the colloidal silica precipitated (separation into two layers occurred) when the chemical mechanical polishing aqueous dispersion was allowed to stand for three months (the polishing properties could not be evaluated). The average particle diameter of the precipitated colloidal silica was 300 nm. This indicates that the colloidal silica aggregated during storage.

In Comparative Example 16, a chemical mechanical polishing aqueous dispersion having the same composition as that of Example 5 was prepared by mixing the first to third compositions immediately after the preparation, and allowed to stand for three months. In the chemical mechanical polishing aqueous dispersion of Comparative Example 6, the colloidal silica precipitated (separation into two layers occurred) when the chemical mechanical polishing aqueous dispersion was allowed to stand for three months (the polishing properties could not be evaluated). The average particle diameter of the precipitated colloidal silica was 310 nm. This indicates that the colloidal silica aggregated during storage.

As is clear from the above results, according to the above chemical mechanical polishing aqueous dispersion preparation kit, since the first to third compositions can be stored separately, aggregation of the colloidal silica contained in the first composition can be suppressed. Therefore, since the chemical mechanical polishing aqueous dispersion can be prepared by mixing the kit including the first to third compositions before use, a chemical mechanical polishing aqueous dispersion having a constant quality can be provided.

According to the above chemical mechanical polishing aqueous dispersion prepared using the chemical mechanical polishing aqueous dispersion preparation kit, a tungsten film can be flatly polished at high speed, and a polishing target surface formed by a tungsten film and an insulating film can also be flatly polished at high speed while suppressing erosion and the like.

The chemical mechanical polishing aqueous dispersion according to one embodiment of the invention is expected to be effective for polishing Cu, Al, W, Ti, TiN, Ta, TaN, V, Mo, Ru, Zr, Mn, Ni, Fe, Ag, Mg, Mn, and Si, a layered structure including these elements, or a structure that does not substantially include a barrier metal.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A chemical mechanical polishing aqueous dispersion that is used to polish a polishing target that includes a wiring layer that contains tungsten, the chemical mechanical polishing aqueous dispersion comprising:

(A) a cationic water-soluble polymer;

(B) an iron (III) compound; and (C) colloidal silica having an average particle diameter calculated from a specific surface area determined by the BET method of 10 to 60 nm, wherein the cationic water-soluble polymer (A) is present in a content ($M_A$) (mass %) of 0.001 to 0.01 mass %, and the colloidal silica (C) is present in a content ($M_C$) (mass %) of 1 to 30 mass %, the content ($M_A$) (mass %) of the cationic water-soluble polymer (A) and the content (Mc) (mass %) of the colloidal silica (C) satisfying the relationship "$M_A/M_c$=0.0001 to 0.003", and the chemical mechanical polishing aqueous dispersion having a pH of 1 to 2.

2. The chemical mechanical polishing aqueous dispersion according to claim 1, wherein the cationic water-soluble polymer (A) is a polyethylenimine.

3. The chemical mechanical polishing aqueous dispersion according to claim 1, wherein the cationic water-soluble polymer (A) has a number average molecular weight of 200 to 1,000,000.

4. The chemical mechanical polishing aqueous dispersion according to claim 1, wherein the iron (III) compound (B) is ferric nitrate.

5. The chemical mechanical polishing aqueous dispersion according to claim 1, wherein the content ($M_B$) (mass %) of the iron (III) compound (B) is 0.01 to 40 mass %.

6. The chemical mechanical polishing aqueous dispersion according to claim 1, wherein the polishing target includes an insulating film having a via-hole, and a tungsten film formed on the insulating film through a barrier metal film.

7. A chemical mechanical polishing method comprising polishing a polishing target that includes a wiring layer that contains tungsten using the chemical mechanical polishing aqueous dispersion according to claim 1.

8. A kit for preparing the chemical mechanical polishing aqueous dispersion according to claim 1, the kit comprising:
   a first composition that has a pH of 8 to 11, and includes at least (C) colloidal silica having an average particle diameter calculated from a specific surface area measured by the BET method of 10 to 60 nm, and (E) a basic compound;
   a second composition that has a pH of 1 to 3, and includes at least (A) a cationic water-soluble polymer and (D) an acidic compound; and
   a third composition that includes at least (B) an iron (III) compound and water.

9. The kit according to claim 8, wherein the basic compound (E) is potassium hydroxide or ammonia.

10. The kit according to claim 8, wherein the acidic compound (D) is an organic acid.

11. The kit according to claim 10, wherein the organic acid is maleic acid or malonic acid.

12. The kit according to claim 8, wherein the cationic water-soluble polymer (A) is a polyethylenimine.

13. The kit according to claim 8, wherein the cationic water-soluble polymer (A) has a number average molecular weight of 200 to 1,000,000.

14. The kit according to claim 8, wherein the iron (III) compound (B) is ferric nitrate.

15. A method of preparing the chemical mechanical polishing aqueous dispersion according to claim 1, the method comprising mixing a first composition that has a pH of 8 to 11, and includes at least (C) colloidal silica having an average particle diameter calculated from a specific surface area measured by the BET method of 10 to 60 nm, and (E) a basic compound, a second composition that has a pH of 1 to 3, and includes at least (A) a cationic water-soluble polymer and (D) an acidic compound, and a third composition that includes at least (B) an iron (III) compound and water.

* * * * *